United States Patent
Yoo et al.

(10) Patent No.: US 9,219,146 B2
(45) Date of Patent: Dec. 22, 2015

(54) HIGH VOLTAGE PMOS AND THE METHOD FOR FORMING THEREOF

(71) Applicant: Monolithic Power Systems, Inc., San Jose, CA (US)

(72) Inventors: Ji-Hyoung Yoo, Cupertino, CA (US); Yanjie Lian, Chengdu (CN)

(73) Assignee: Monolithic Power Systems, Inc., San Jose, CA (US)

(*) Notice: Subject to any disclaimer, the term of this patent is extended or adjusted under 35 U.S.C. 154(b) by 70 days.

(21) Appl. No.: 14/142,582

(22) Filed: Dec. 27, 2013

(65) Prior Publication Data

US 2015/0187931 A1 Jul. 2, 2015

(51) Int. Cl.
*H01L 29/78* (2006.01)
*H01L 29/66* (2006.01)

(52) U.S. Cl.
CPC ...... *H01L 29/7816* (2013.01); *H01L 29/66681* (2013.01)

(58) Field of Classification Search
CPC .............. H01L 29/401; H01L 29/7816; H01L 29/0878; H01L 29/1087; H01L 29/42368; H01L 29/41758; H01L 29/66681; H01L 29/66477; H01L 21/28211; H01L 21/8222; H01L 27/11206; H01L 27/0262
USPC ................. 257/339, 288, 335–336, 331, 343; 438/197, 286, 237, 301
See application file for complete search history.

(56) References Cited

U.S. PATENT DOCUMENTS

| | | | | |
|---|---|---|---|---|
| 5,517,046 A * | 5/1996 | Hsing et al. | | 257/336 |
| 5,844,275 A * | 12/1998 | Kitamura et al. | | 257/335 |
| 6,680,515 B1 | 1/2004 | Hsing | | |
| 8,198,679 B2 | 6/2012 | Yoo | | |
| 2006/0244099 A1* | 11/2006 | Kurjanowicz | | 257/530 |
| 2010/0102388 A1* | 4/2010 | Levin et al. | | 257/343 |
| 2010/0308404 A1* | 12/2010 | Park et al. | | 257/336 |
| 2011/0073942 A1* | 3/2011 | Banerjee et al. | | 257/335 |
| 2012/0205714 A1* | 8/2012 | Salcedo et al. | | 257/140 |
| 2012/0280317 A1* | 11/2012 | Lee et al. | | 257/335 |
| 2012/0286359 A1* | 11/2012 | Lin et al. | | 257/335 |
| 2012/0320476 A1 | 12/2012 | Disney | | |
| 2013/0032895 A1 | 2/2013 | Disney | | |
| 2013/0069712 A1* | 3/2013 | Trajkovic et al. | | 327/537 |
| 2013/0161740 A1 | 6/2013 | Disney | | |
| 2013/0228831 A1* | 9/2013 | Chin et al. | | 257/288 |

* cited by examiner

*Primary Examiner* — Kenneth Parker
*Assistant Examiner* — Bo Fan
(74) *Attorney, Agent, or Firm* — Perkins Coie LLP

(57) ABSTRACT

A high voltage PMOS replacing the lightly doped region of the drain region with a low voltage P-well adopted in the low voltage devices, so as to save a mask. In order to achieve the high breakdown voltage and the low on resistance, a thick gate oxide applied in the DMOS is inserted. The N-type well region surrounding the source region may be replaced by a low voltage N-well adopted in the low voltage device to further save a mask.

18 Claims, 7 Drawing Sheets

HIGH VOLTAGE PMOS AND THE METHOD FOR FORMING THEREOF

TECHNICAL FIELD

The present invention relates to semiconductor devices, more specifically, the present invention relates to PMOS (P-type Metal Oxide Semiconductor) devices.

BACKGROUND

For BCD (Bipolar CMOS DMOS) technology, a common way to make a high voltage PMOS is to use an additional mask for a lightly doped drain region surrounding a highly doped drain region. In order to save the additional mask, conventional P-well of low voltage devices may be adopted to form high voltage PMOS drain region. But the ion concentration of the low voltage P-well is too high for the high voltage PMOS drain, so that the breakdown voltage of the high voltage PMOS may be not high enough.

SUMMARY

It is an object of the present invention to provide an improved high voltage PMOS, which solves above problems.

In accomplishing the above and other objects, there has been provided, in accordance with an embodiment of the present invention, a high voltage PMOS, comprising: a P-type substrate; an N-buried layer (NBL) formed on the P-type substrate; an epitaxy formed on the NBL; a field oxide formed on the epitaxy; a low voltage P-well formed in the epitaxy; an N-type well region formed in the epitaxy; a thick gate oxide formed on the low voltage P-well and the field oxide; a thin gate oxide formed on the N-type well region, on the low voltage P-well and on the epitaxy; a gate poly formed on the thin gate oxide and on the thick gate oxide; an N-type highly doped region formed in the N-type well region, wherein the N-type highly doped region is adjacent to the second P-type highly doped region; a first P-type highly doped region formed in the low voltage P-well, wherein the first P-type highly doped region is adjacent to the field oxide; and a second P-type highly doped region formed in the N-type well region, wherein the second P-type highly doped region is adjacent to the gate poly, and is tied to the N-type highly doped region electrically; wherein the space between N-type well region and the low voltage P-well is in a range of 0.5 µm~1 µm.

In addition, there has been provided, in accordance with an embodiment of the present invention, a method for forming a high voltage PMOS, comprising: forming an NBL on a P-type substrate; forming an epitaxy on the NBL and the P-type substrate; forming a field oxide in the epitaxy with shallow-trench isolation process; forming a low voltage P-well in the epitaxy; forming an N-type well region in the epitaxy; forming a thick gate oxide on the low voltage P-well and the field oxide; forming a thin gate oxide on the N-type well region, the low voltage P-well, the field oxide and the epitaxy; forming a gate poly on the thin gate oxide and the thick gate oxide; forming an N-type highly doped region in the N-type well region; forming a first P-type highly doped region in the low voltage P-well, wherein the first P-type highly doped region is adjacent to the field oxide; and forming a second P-type highly doped region in the N-type base region, wherein the second P-type highly doped region is adjacent to the gate poly and the N-type highly doped region; wherein the N-type well region and the low voltage P-well is spaced away 0.5 um~1 um.

Furthermore, there has been provided, in accordance with an embodiment of the present invention, a method for forming a high voltage PMOS, comprising: forming an NBL on a P-type substrate; forming an epitaxy on the NBL and the P-type substrate; forming a low voltage P-well in the epitaxy; forming an N-type well region in the epitaxy; forming a field oxide in the low voltage P-well with local oxidation of silicon process; forming a thick gate oxide on the low voltage P-well, wherein the thick gate oxide is adjacent to the field oxide; forming a thin gate oxide on the N-type well region, the low voltage P-well, and the epitaxy; forming a gate poly on the thin gate oxide, the thick gate oxide and the field oxide; forming an N-type highly doped region in the N-type well region; forming a first P-type highly doped region in the low voltage P-well, wherein the first P-type highly doped region is adjacent to the field oxide; and forming a second P-type highly doped region in the N-type base region, wherein the second P-type highly doped region is adjacent to the gate poly and the N-type highly doped region; wherein the N-type well region and the low voltage P-well is spaced away 0.5 um~1 um.

The use of the similar reference label in different drawings indicates the same of like components.

DETAILED DESCRIPTION

Embodiments of circuits/structures for high voltage PMOS are described in detail herein. In the following description, some specific details, such as example circuits for these circuit components, are included to provide a thorough understanding of embodiments of the invention. One skilled in relevant art will recognize, however, that the invention can be practiced without one or more specific details, or with other methods, components, materials, etc.

The following embodiments and aspects are illustrated in conjunction with circuits and methods that are meant to be exemplary and illustrative. In various embodiments, the above problem has been reduced or eliminated, while other embodiments are directed to other improvements.

Figure 1:
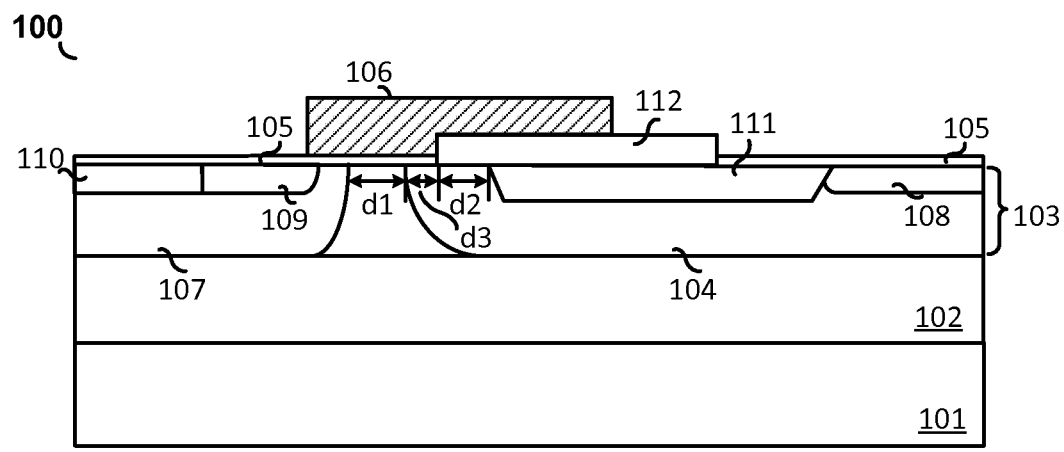
FIG. 1 schematically shows a cross-section view of a high voltage PMOS 100 in accordance with an embodiment of the present invention.

FIG. 1 schematically shows a cross-section view of a high voltage PMOS 100 in accordance with an embodiment of the present invention. In the example of FIG. 1, the high voltage PMOS 100 comprises: a P-type substrate 101; an N-buried layer (NBL) 102 formed on the P-type substrate 101; an epitaxy 103 formed on the NBL 102; a field oxide 111 formed on the epitaxy 103; a low voltage P-well 104 formed in the epitaxy 103; an N-type well region 107 formed in the epitaxy 103; a thick gate oxide 112 formed on the low voltage P-well 104 and on the field oxide 111; a thin gate oxide 105 formed on the N-type well region 107, on the low voltage P-well 104 and on the epitaxy 103; a gate poly 106 formed on the thin gate oxide 105 and the thick gate oxide 112; an N-type highly doped region 110 (e.g., N⁺) serving as body pickup formed in the N-type well region 107; a first P-type highly doped region 108 (e.g., P⁺) formed in the low voltage P-well 104, wherein the first P-type highly doped region 108 is adjacent to the field oxide 111; and a second P-type highly doped region 109 (e.g., P⁺) formed in the N-type well region 107, wherein the second P-type highly doped region 109 is adjacent to the gate poly 106, and is tied to the N-type highly doped region 110 electrically; wherein the space d1 between N-type well region 107 and the low voltage P-well is in a range of 0.5 μm~1 μm.

In one embodiment, the thick gate oxide 112 has a thickness in a range of 300 Å to 500 Å. The thick gate oxide 112 is inserted before the thin gate oxide 105, and covers on the low voltage P-well 104 and partial of the field oxide 111. As shown in FIG. 1, under the gate poly 106, the thick gate oxide 112 has an extension d2 in a range of 0.3 μm to 0.5 μm from the edge of the field oxide 111. Meanwhile, the side wall of the low voltage P-well 104 has an extension d3 in a range of 0.1 μm to 0.2 μm from the edge of the thick gate oxide 112.

The material of the N-type well region 107 is low voltage N-well applied in low voltage devices, e.g., low voltage MOSFET, capacitor or other devices integrated with the high voltage PMOS.

In advanced BCD technologies, Bipolar, CMOS and DMOS, also high voltage devices and low voltage devices, are always integrated in a chip. In the present invention, the low voltage P-well 104 that is used in the low voltage devices (e.g. LV NMOS) is applied in the high voltage PMOS 100— In the prior art, an additional lightly doped P-well layer is used for high voltage PMOS drain region. Thus, an additional mask for lightly doped region P-well layer is saved. Normally, the low voltage P-well has a higher ion concentration than the lightly doped region in the conventional high voltage PMOS drain region. The replacement alone may decrease the breakdown voltage of the high voltage PMOS. In the present invention, the insertion of the thick gate oxide helps to improve the breakdown voltage. Meanwhile, the space d1 between the N-type well region 107 and the low voltage P-well 104 is limited in a range 0.5 μm to 1 μm in order to get high breakdown voltage. In one embodiment, the breakdown voltage of the high voltage PMOS may reach 40 volts. Because the thick gate oxide is applied in DMOS of advanced BCD technology, the insertion of the thick gate oxide to the high voltage PMOS needs no extra mask or process. Furthermore, the on resistance, Ron, of the high voltage PMOS of the present invention is lower than the prior art high voltage PMOS since the present invention adopts comparatively highly doped low voltage P-well as drain region.

In the example of FIG. 1, the field oxide 111 is formed with shallow-trench isolation (STI) process. Persons of ordinary skill in the art should know that the field oxide may be formed with other process.

Figure 2:
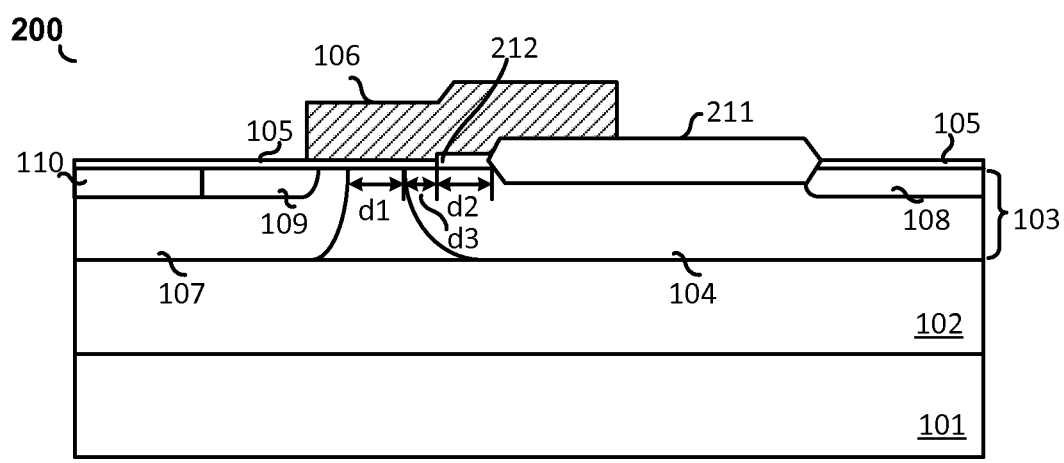
FIG. 2 schematically shows a cross-section view of a high voltage PMOS 200 in accordance with an embodiment of the present invention.

FIG. 2 schematically shows a cross-section view of a high voltage PMOS 200 in accordance with an embodiment of the present invention. The high voltage PMOS 200 has a similar structure with the high voltage PMOS 100 except for the field oxide. The field oxide 211 in the high voltage PMOS 200 is formed with local oxidation of silicon (LOCOS) process. Furthermore, the gate poly 106 is extended to the field oxide 211.

Similar with the high voltage PMOS 100, the thick gate oxide 212 has a thickness in a range of 300 Å to 500 Å. The thick gate oxide 212 is inserted before the thin gate oxide 105, and covers on partial of the low voltage P-well 104. As shown in FIG. 2, under the gate poly 106, the thick gate oxide 212 has an extension d2 in a range of 0.3 μm to 0.5 μm from the edge of the field oxide 211. Meanwhile, the side wall of the low voltage P-well 104 has an extension d3 of 0.1 μm to 0.2 μm from the edge of the thick gate oxide 212.

FIGS. 3A-3I partially schematically show cross-section views of a semiconductor substrate undergoing a process for forming the high voltage PMOS 100 in accordance with an embodiment of the present invention.

Figure 3A:
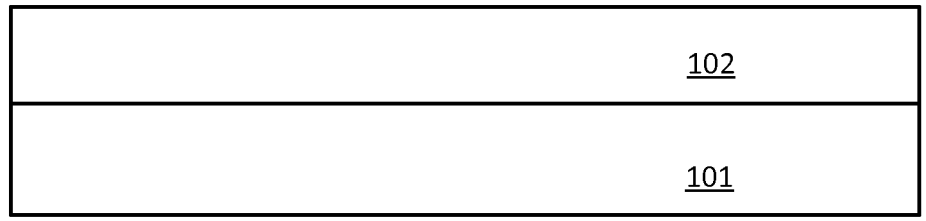
FIGS. 3A-3I partially schematically show cross-section views of a semiconductor substrate undergoing a process for forming the high voltage PMOS 100 in accordance with an embodiment of the present invention.

As shown in FIG. 3A, the process includes forming the NBL 102 on the substrate 101.

Figure 3B:

As shown in FIG. 3B, the process includes forming an epitaxy 103 on the NBL 102. Figures in the present invention only shows the cross-section view of the high voltage PMOS. Persons of ordinary skill in the art should know that the NBL 102 only covers partial of the substrate 101. The epitaxy 103 covers both the NBL 102 and partial of the substrate 101 that is uncovered by the NBL 102. In one embodiment, the epitaxy 103 may be formed by deposition technique such as chemical vapor deposition (CVD), plasma enhance chemical vapor deposition (PECVD), atomic layer deposition (ALD), liquid phase epitaxy, and/or other suitable deposition techniques. In one embodiment, the epitaxy 103 may be doped with P-type impurities.

Figure 3C:
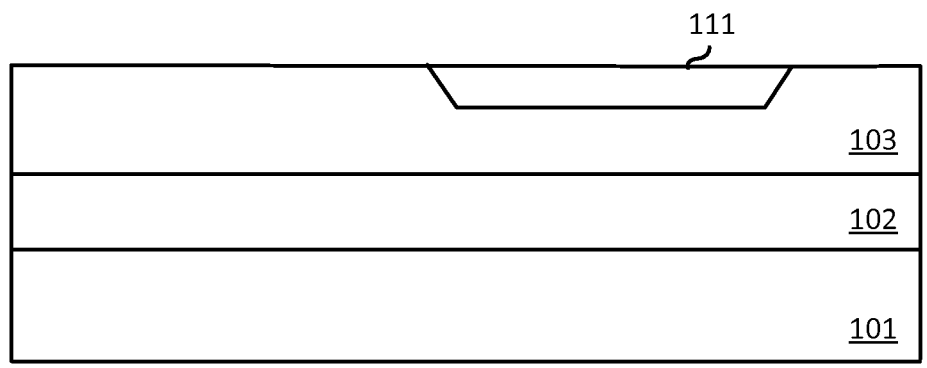

As shown in FIG. 3C, the process includes forming a field oxide 111 in the epitaxy 103. In the example of FIG. 3C, the field oxide 111 is formed as a STI structure. In one embodiment, the field oxide 111 may be formed by wet oxidation technique.

Figure 3D:
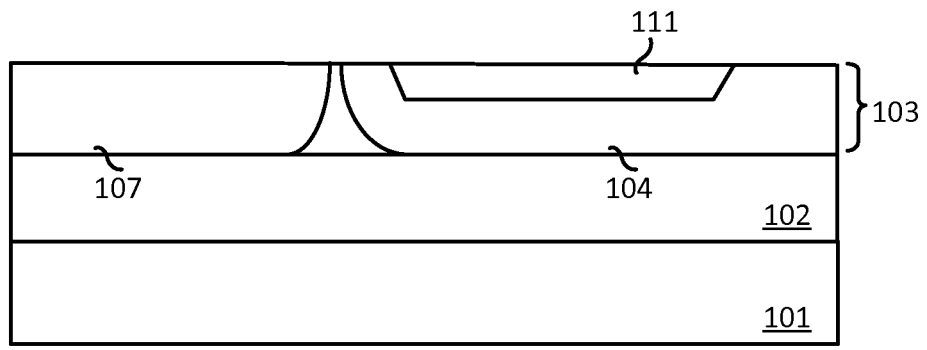

As shown in FIG. 3D, the process includes forming a low voltage P-well 104 and then an N-type well region 107 in the epitaxy 103. The low voltage P-well 104 is applied in the low voltage devices integrated with the high voltage PMOS, so that a mask for lightly doped region of the drain in the prior art high voltage PMOS is saved. The N-type well region 107 and the low voltage P-well 104 is spaced away 0.5 um~1 um in order to have a high breakdown voltage.

Figure 3E:
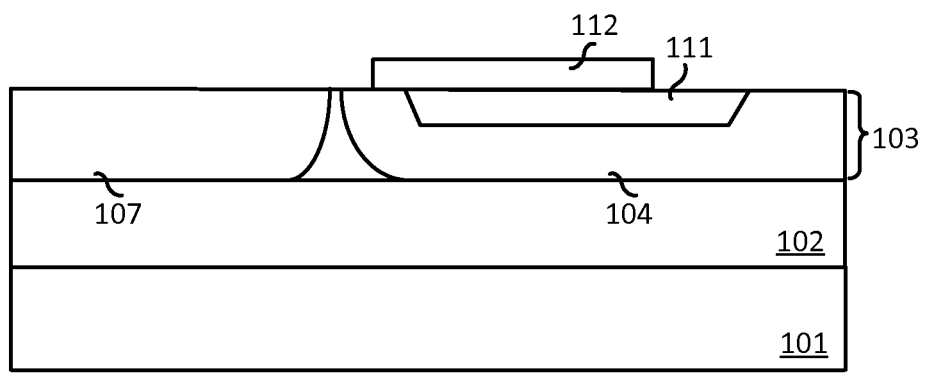

As shown in FIG. 3E, the process includes forming a thick gate oxide 112 on the low voltage P-well 104 and on the field oxide 111. Thick gate oxide is normally applied in DMOS. Thus, the insertion of the thick gate oxide 112 in the high voltage PMOS needs no extra mask. The thick gate oxide 112 may have a thickness of 300 Å to 500 Å. The thick gate oxide may be formed by thermal oxidation or deposition technique.

Figure 3F:
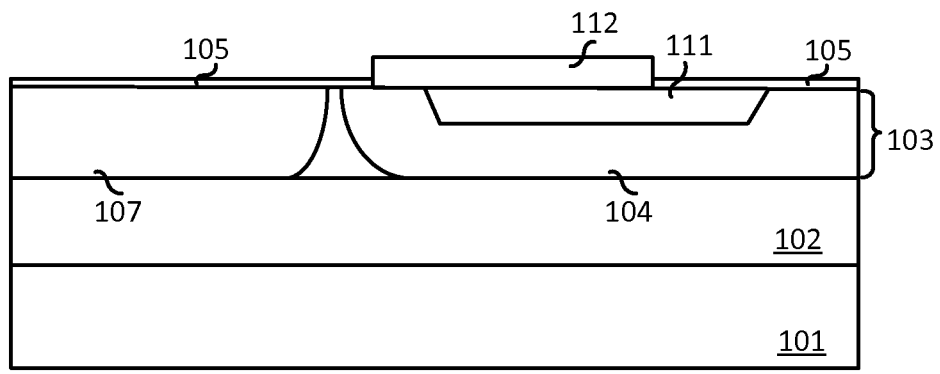

As shown in FIG. 3F, the process includes forming a thin gate oxide 105. In one embodiment, the gate oxide 105 may be formed by dry oxidation technology.

Figure 3G:
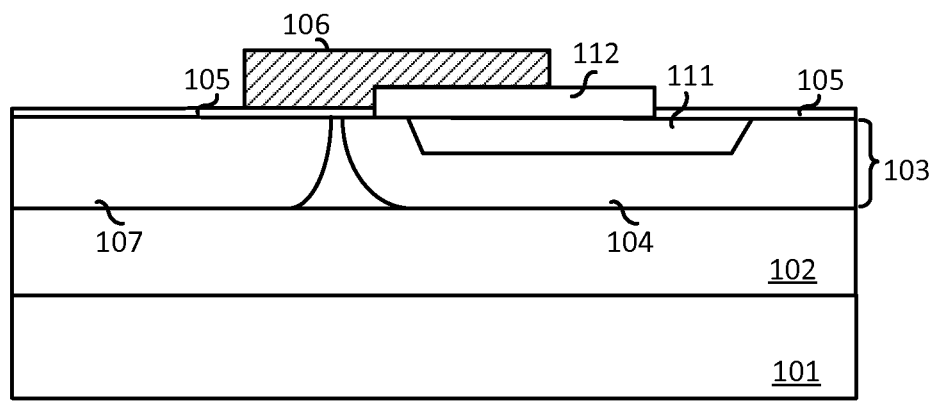

As shown in FIG. 3G, the process includes forming a gate poly 106 on the thin gate oxide 105 and on the thick gate oxide 112.

Figure 3H:
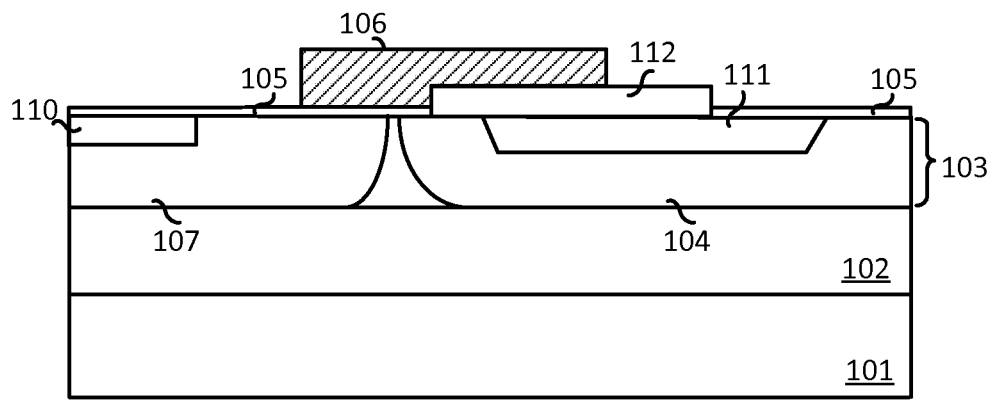

As shown in FIG. 3H, the process includes forming an N-type highly doped region 110 in the N-type well region 107. In one embodiment, the N-type highly doped region 110 may be formed by diffusion technology or implantation technology.

Figure 3I:
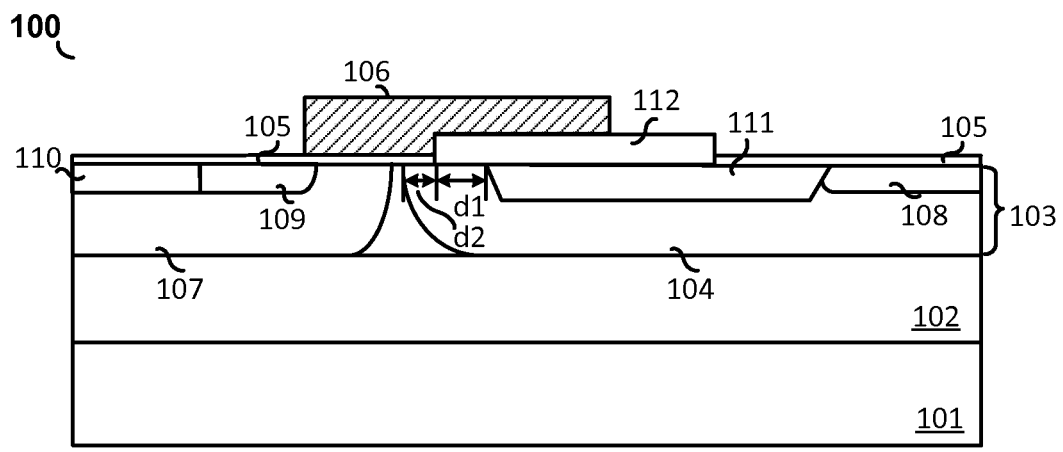

As shown in FIG. 3I, the process includes forming a first P-type highly doped region 108 in the low voltage P-well 104, and forming a second P-type highly doped region 109 in the N-type well region 107. In one embodiment, the first P-type highly doped region 108 and the second P-type highly doped region 109 may be formed by diffusion technology or implantation technology.

In one embodiment, the N-type well region 107 may be replaced by the low voltage N-well. Because the low voltage N-well is applied in the low voltage devices integrated with the high voltage PMOS, the replacement may save a mask too.

FIGS. 4A-4I partially schematically show cross-section views of a semiconductor substrate undergoing a process for forming the high voltage PMOS 200 in accordance with an embodiment of the present invention.

Figure 4A:
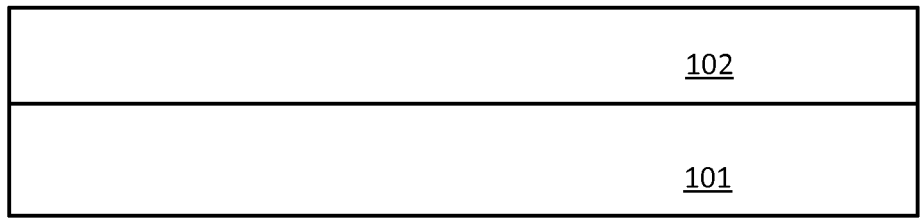
FIGS. 4A-4I partially schematically show cross-section views of a semiconductor substrate undergoing a process for forming the high voltage PMOS 200 in accordance with an embodiment of the present invention.

As shown in FIG. 4A, the process includes forming the NBL 102 on the substrate 101.

Figure 4B:

As shown in FIG. 4B, the process includes forming the epitaxy 103 on the NBL 102. Figures in the present invention only shows the cross-section view of the high voltage PMOS. Persons of ordinary skill in the art should know that the NBL 102 only covers partial of the substrate 101. The epitaxy 103 covers the NBL 102 and the substrate 101 uncovered by the NBL 102. In one embodiment, the epitaxy 103 may be formed by deposition technique such as chemical vapor deposition (CVD), plasma enhance chemical vapor deposition (PECVD), atomic layer deposition (ALD), liquid phase epitaxy, and/or other suitable deposition techniques. In one embodiment, the epitaxy 103 may be doped with P-type impurities.

Figure 4C:
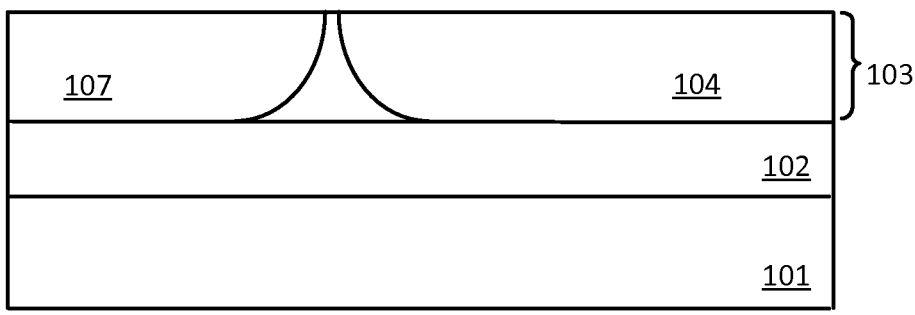

As shown in FIG. 4C, the process includes forming the low voltage P-well 104 and then an N-type well region 107 in the epitaxy 103. The low voltage P-well 104 is applied in the low voltage devices integrated with the high voltage PMOS, so that a mask for lightly doped region of the drain in the prior art high voltage PMOS is saved. The N-type well region 107 and the low voltage P-well 104 is spaced away 0.5 um~1 um in order to have high breakdown voltage.

Figure 4D:
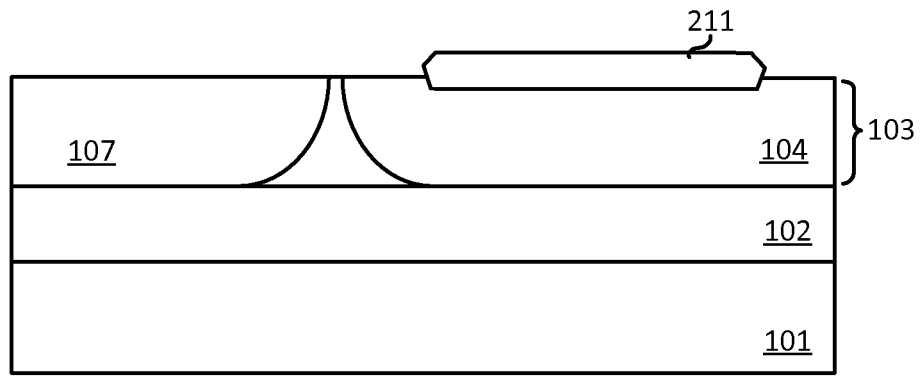

As shown in FIG. 4D, the process includes forming the field oxide 211 in the low voltage P-well 104. In one embodiment, the field oxide 211 may be formed by wet oxidation technique.

Figure 4E:
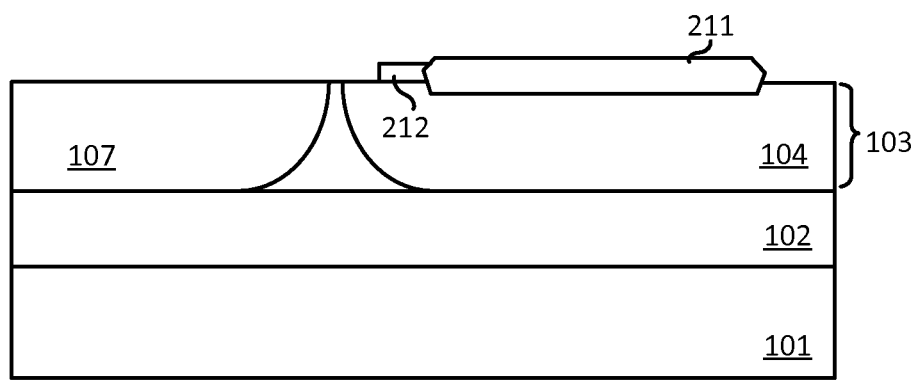

As shown in FIG. 4E, the process includes forming the thick gate oxide 212 on the low voltage P-well 104, wherein the thick gate oxide is adjacent to the field oxide. Thick gate oxide is normally applied in DMOS. Thus, the insertion of the thick gate oxide 212 in the high voltage PMOS needs no extra mask. The thick gate oxide 212 may have a thickness of 300 Å to 500 Å. In the example of FIG. 4E, the thick gate oxide 212 is formed by thermal oxidation. Persons of ordinary skill in the art should know that the thick gate oxide 212 may be formed by deposition technique too. The thick gate oxide will cover the field oxide 211 too if it is formed by deposition technique.

Figure 4F:
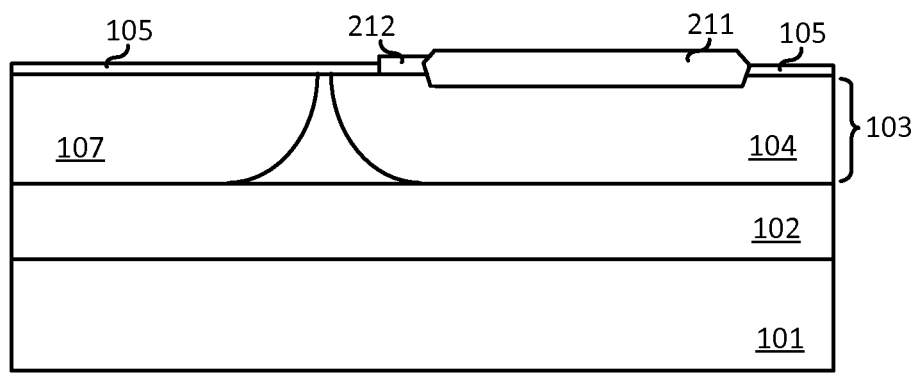

As shown in FIG. 4F, the process includes forming the thin gate oxide 105. In one embodiment, the gate oxide 105 may be formed by dry oxidation technology.

Figure 4G:
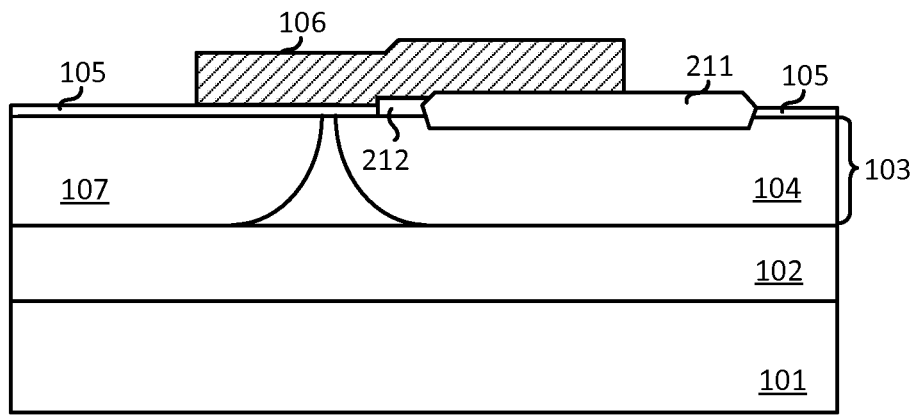

As shown in FIG. 4G, the process includes forming the gate poly 106 on the thin gate oxide 105, the thick gate oxide 212 and the field oxide 211.

Figure 4H:
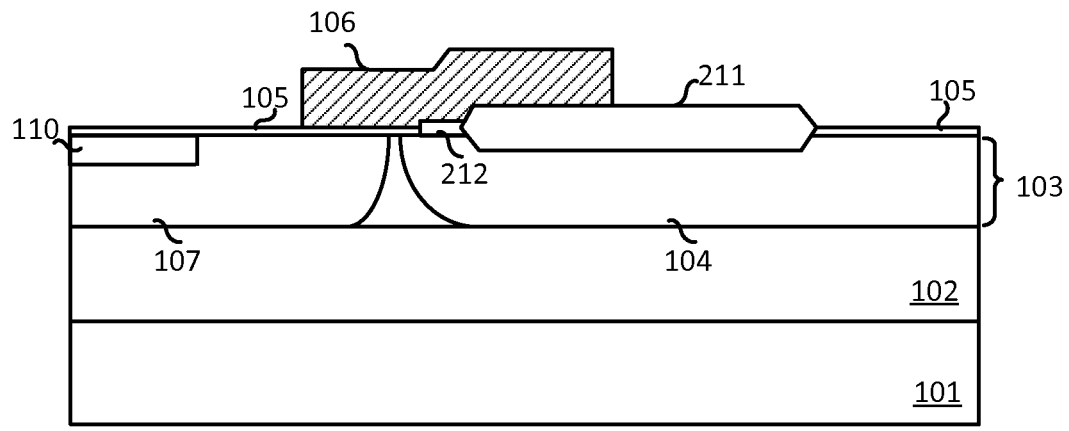

As shown in FIG. 4H, the process includes forming the N-type highly doped region 110 in the N-type well region 107. In one embodiment, the N-type highly doped region 110 may be formed by diffusion technology or implantation technology.

Figure 4I:
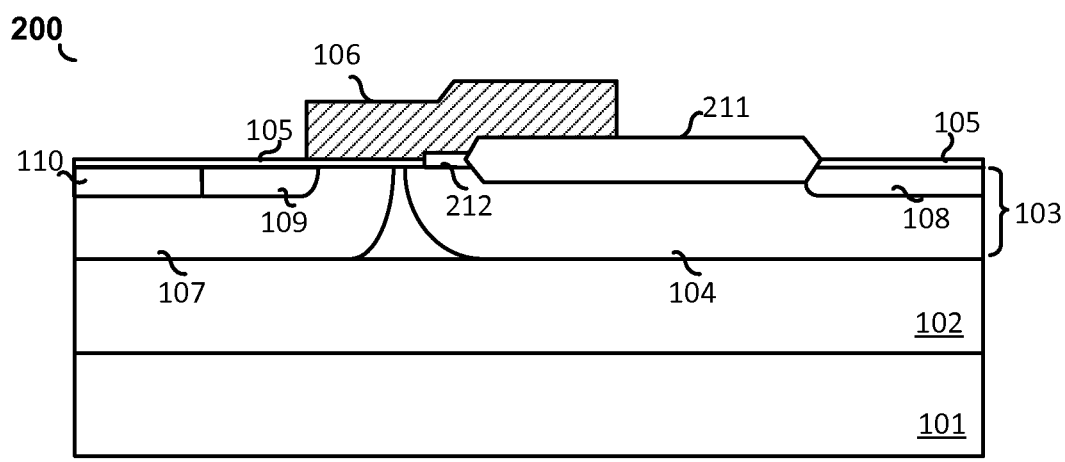

As shown in FIG. 4I, the process includes forming the first P-type highly doped region 108 in the low voltage P-well 104, and forming the second P-type highly doped region 109 in the N-type well region 107. In one embodiment, the first P-type highly doped region 108 and the second P-type highly doped region 109 may be formed by diffusion technology or implantation technology.

In one embodiment, the N-type well region 107 may be replaced by the low voltage N-well. Because the low voltage N-well is applied in the low voltage devices integrated with the high voltage PMOS, the replacement may save a mask too.

Several embodiments of the foregoing high voltage PMOS have at least one mask saved compared to conventional high voltage PMOS. Unlike the conventional technique, several embodiments of the foregoing high voltage PMOS replace the lightly doped region of the drain with a low voltage P-well applied in the low voltage devices; meanwhile, a thick gate oxide applied in DMOS is inserted under the gate poly of the low voltage PMOS. Thus, the present high voltage PMOS may achieve high breakdown voltage and low on resistance while saving a mask for the lightly doped region of the drain in prior art high voltage PMOS. In addition, the N-type well region in the prior art high voltage PMOS may be replaced by the low voltage N-well applied in the low voltage devices so as to further save a mask.

This written description uses examples to disclose the invention, including the best mode, and also to enable a person skilled in the art to make and use the invention. The patentable scope of the invention may include other examples that occur to those skilled in the art.

We claim:

1. A high voltage PMOS, comprising:
   a P-type substrate;
   an N-buried layer (NBL) formed on the P-type substrate;
   an epitaxy formed on the NBL;
   a field oxide formed on the epitaxy;
   a low voltage P-well formed in the epitaxy;
   an N-type well region formed in the epitaxy;
   a thick gate oxide formed on the low voltage P-well and the field oxide;
   a thin gate oxide formed on the N-type well region, on the low voltage P-well and on the epitaxy;
   a gate poly formed on the thin gate oxide and on the thick gate oxide;
   an N-type highly doped region formed in the N-type well region, wherein the N-type highly doped region is adjacent to the second P-type highly doped region;
   a first P-type highly doped region formed in the low voltage P-well, wherein the first P-type highly doped region is adjacent to the field oxide; and
   a second P-type highly doped region formed in the N-type well region, wherein the second P-type highly doped region is adjacent to the gate poly, and is tied to the N-type highly doped region electrically;
   wherein the space between N-type well region and the low voltage P-well is in a range of 0.5 μm~1 μm.

2. The high voltage PMOS of claim 1, wherein the thick gate oxide has a thickness in a range of 300 Å to 500 Å.

3. The high voltage PMOS of claim 1, wherein the thick gate oxide has an extension of 0.3 μm to 0.5 μm from the edge of field oxide under the gate poly.

4. The high voltage PMOS of claim 1, wherein the low voltage P-well has an extension of 0.1 μm to 0.2 μm from the edge of the thick gate oxide under the gate poly.

5. The high voltage PMOS of claim 1, wherein the material of the N-type well region is a low voltage N-well applied in low voltage devices.

6. The high voltage PMOS of claim 1, wherein the field oxide is formed with shallow-trench isolation process.

7. The high voltage PMOS of claim 1, wherein the field oxide is formed with local oxidation of silicon process.

8. The high voltage PMOS of claim 7, wherein the gate poly is extended to the field oxide.

9. A method for forming a high voltage PMOS, comprising:
   forming an NBL on a P-type substrate;
   forming an epitaxy on the NBL and the P-type substrate;

forming a field oxide in the epitaxy with shallow-trench isolation process;
forming a low voltage P-well in the epitaxy;
forming an N-type well region in the epitaxy;
forming a thick gate oxide on the low voltage P-well and the field oxide;
forming a thin gate oxide on the N-type well region, the low voltage P-well, the field oxide and the epitaxy;
forming a gate poly on the thin gate oxide and the thick gate oxide;
forming an N-type highly doped region in the N-type well region;
forming a first P-type highly doped region in the low voltage P-well, wherein the first P-type highly doped region is adjacent to the field oxide; and
forming a second P-type highly doped region in the N-type base region, wherein the second P-type highly doped region is adjacent to the gate poly and the N-type highly doped region;
wherein the N-type well region and the low voltage P-well is spaced away 0.5 um~1 um.

10. The method of claim 9, wherein the thick gate oxide has a thickness in a range of 300 Å to 500 Å.

11. The method of claim 9, wherein the thick gate oxide has an extension of 0.3 μm to 0.5 μm from the edge of field oxide under the gate poly.

12. The method of claim 9, wherein the low voltage P-well has an extension of 0.1 μm to 0.2 μm from the edge of the thick gate oxide under the gate poly.

13. The method of claim 9, wherein the N-type well region is a low voltage N-well applied in the low voltage devices.

14. A method for forming a high voltage PMOS, comprising:
forming an NBL on a P-type substrate;
forming an epitaxy on the NBL and the P-type substrate;
forming a low voltage P-well in the epitaxy;
forming an N-type well region in the epitaxy;
forming a field oxide in the low voltage P-well with local oxidation of silicon process;
forming a thick gate oxide on the low voltage P-well, wherein the thick gate oxide is adjacent to the field oxide;
forming a thin gate oxide on the N-type well region, the low voltage P-well, and the epitaxy;
forming a gate poly on the thin gate oxide, the thick gate oxide and the field oxide;
forming an N-type highly doped region in the N-type well region;
forming a first P-type highly doped region in the low voltage P-well, wherein the first P-type highly doped region is adjacent to the field oxide; and
forming a second P-type highly doped region in the N-type base region, wherein the second P-type highly doped region is adjacent to the gate poly and the N-type highly doped region;
wherein the N-type well region and the low voltage P-well is spaced away 0.5um~1um.

15. The method of claim 14, wherein the thick gate oxide has a thickness in a range of 300 Å to 500 Å.

16. The method of claim 14, wherein the thick gate oxide has an extension of 0.3 μm to 0.5 μm from the edge of field oxide under the gate poly.

17. The method of claim 14, wherein the low voltage P-well has an extension of 0.1 μm to 0.2 μm from the edge of the thick gate oxide under the gate poly.

18. The method of claim 14, wherein the N-type well region is a low voltage N-well applied in the low voltage devices.

* * * * *